(12) United States Patent
Ching et al.

(10) Patent No.: US 12,211,921 B2
(45) Date of Patent: Jan. 28, 2025

(54) METHOD FOR FORMING FinFET DEVICES WITH A fin TOP HARDMASK

(71) Applicant: TAIWAN SEMICONDUCTOR MANUFACTURING CO., LTD., Hsinchu (TW)

(72) Inventors: Kuo-Cheng Ching, Hsinchu County (TW); Kai-Chieh Yang, Kaohsiung (TW); Ching-Wei Tsai, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 457 days.

(21) Appl. No.: 17/576,854

(22) Filed: Jan. 14, 2022

(65) Prior Publication Data

US 2022/0140103 A1    May 5, 2022

Related U.S. Application Data

(62) Division of application No. 15/981,638, filed on May 16, 2018, now Pat. No. 11,227,932.

(51) Int. Cl.
*H01L 21/28* (2006.01)
*H01L 29/49* (2006.01)
*H01L 29/66* (2006.01)
*H01L 29/78* (2006.01)

(52) U.S. Cl.
CPC .... *H01L 29/4983* (2013.01); *H01L 21/28088* (2013.01); *H01L 29/4966* (2013.01); *H01L 29/66545* (2013.01); *H01L 29/66795* (2013.01); *H01L 29/7851* (2013.01)

(58) Field of Classification Search
CPC ........... H01L 21/28088; H01L 29/0847; H01L 29/4966; H01L 29/4983; H01L 29/66545; H01L 29/66795; H01L 29/6681; H01L 29/785; H01L 29/7851
See application file for complete search history.

(56) References Cited

U.S. PATENT DOCUMENTS

| 7,824,969 | B2 | 11/2010 | Zhu |
| 2007/0063224 | A1 | 3/2007 | Watanabe et al. |
| 2007/0111435 | A1 | 5/2007 | Kim et al. |
| 2009/0184369 | A1 | 7/2009 | Zhu |
| 2014/0131776 | A1 | 5/2014 | Ching et al. |
| 2014/0191300 | A1* | 7/2014 | Jhaveri ............... H01L 29/0638 257/288 |
| 2015/0061027 | A1* | 3/2015 | Hong ................ H01L 21/28185 438/585 |

(Continued)

*Primary Examiner* — Matthew C Landau
*Assistant Examiner* — Dmitriy Yemelyanov
(74) *Attorney, Agent, or Firm* — Maschoff Brennan

(57) ABSTRACT

Aspects of the disclosure provide a method for forming a fin field effect transistor (FinFET) incorporating a fin top hardmask on top of a channel region of a fin. Because of the presence of the fin top hardmask, a gate height of the FinFET can be reduced without affecting proper operations of vertical gate channels on sidewalls of the fin. Consequently, parasitic capacitance between a gate stack and source/drain contacts of the FinFET can be reduced by lowering the gate height of the FinFET.

20 Claims, 10 Drawing Sheets

(56) References Cited

U.S. PATENT DOCUMENTS

| | | | |
|---|---|---|---|
| 2015/0129830 A1* | 5/2015 | Sung | H01L 21/0332 438/283 |
| 2015/0200252 A1* | 7/2015 | Ching | H01L 29/0649 438/435 |
| 2015/0340289 A1 | 11/2015 | Park et al. | |
| 2015/0357470 A1 | 12/2015 | Cheng et al. | |
| 2016/0064398 A1 | 3/2016 | Toh et al. | |
| 2016/0190325 A1 | 6/2016 | Liu et al. | |
| 2017/0110555 A1 | 4/2017 | Lian et al. | |
| 2017/0358687 A1 | 12/2017 | Nimi et al. | |

\* cited by examiner

METHOD FOR FORMING FinFET DEVICES WITH A fin TOP HARDMASK

PRIORITY CLAIM AND CROSS-REFERENCE

This application is a divisional application of U.S. patent application Ser. No. 15/981,638, filed May 16, 2018, now U.S. Pat. No. 11,227,932, issued on Jan. 18, 2022, which is herein incorporated by reference in its entirety.

BACKGROUND

A fin field effect transistor (FinFET) has a three dimensional gate structure built around a semiconductor strip (referred to as the "fin"). Conductive channels are formed on the vertical sidewalls, as well as the top surface of a portion of the fin sandwiched by the three dimensional gate structure. Compared with a traditional FET device that has a planar structure, a FinFET device can have a larger effective channel width and an increased drive current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
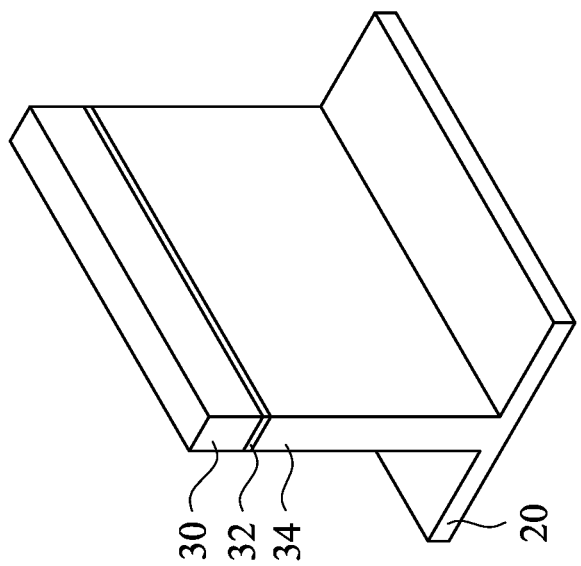
FIGS. 1-9 are perspective views of intermediate stages in the formation of FinFET devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure provide a fin field effect transistor (FinFET) device that includes a gate structure over a semiconductor fin. The gate structure includes a layer of hardmask on top of the semiconductor fin. This layer of hardmask is referred to as a fin top hardmask. Existence of the fin top hardmask enables a gate height of the gate structure being reduced without affecting proper operations of the vertical channels formed at the sidewalls of the fin. As the gate height is reduced, a parasitic capacitance across a spacer between a source/drain contact and the gate structure can be decreased, resulting in an improved AC performance of the FinFET device. For example, a gate height reduction of 1 nm can lead to 0.4% reduction of parasitic capacitance across a spacer in accordance with some embodiments.

In addition, the fin top hardmask can be used as an etch stop layer during a gate replacement process. For example, an etch process may be performed to remove dummy polysilicon of a dummy gate sandwiching a fin. Existence of a fin top hardmask can reduce or avoid risk of inducing etch damage to the top surface of the fin structure.

Some fabrication processes for forming FinFET devices with a fin top hardmask structure are described with reference to FIG. 1 through FIG. 13B. FIG. 1 through FIG. 13B illustrate perspective views and cross-sectional views of intermediate stages in the formation of the FinFET devices.

Figure 1:
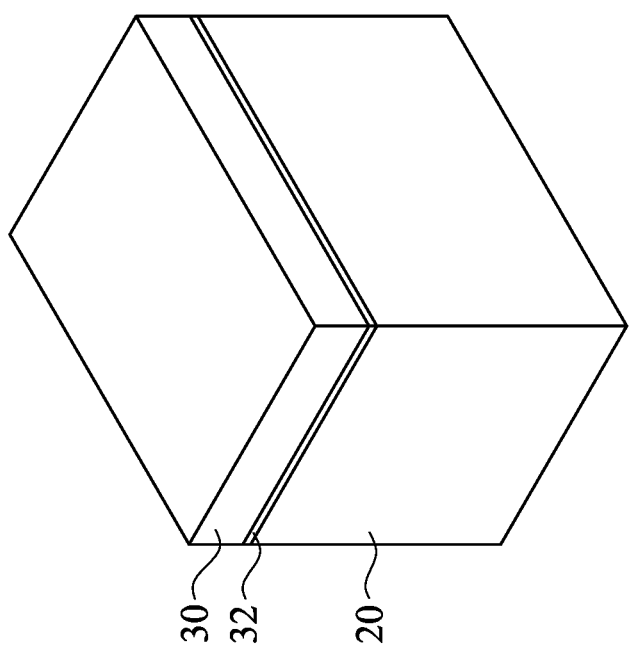

In FIG. 1, a substrate 20 is provided. The substrate 20 may be a semiconductor substrate, such as a bulk semiconductor substrate, a semiconductor-on-insulator (SOI) substrate, a multi-layered or gradient substrate, or the like. The substrate 20 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 20 may be doped or un-doped. In a specific example, the substrate 20 is a bulk silicon substrate.

Further in FIG. 1, a pad layer 32 and a hardmask layer 30 are formed on the substrate 20. The pad layer 32 can be an oxide formed by oxidizing a surface of the substrate 20, such as by a thermal oxidation, chemical oxidation, or the like. In some embodiments, the pad layer 32 may act as an adhesion layer, and reduces a strain between the substrate 20 and the followed hardmask layer 30. In some embodiments, the pad layer 32 may further act as an etch stop layer for etching the hardmask layer 30. In some embodiments, the hardmask layer 30 may be formed directly on the substrate 20 without forming a pad layer. The hardmask layer 30 can be silicon carbon nitride (SiCN), silicon nitride (SiN), silicon oxycarbonitride (SiOCN), silicon oxynitride (SiON), and the like, or a combination thereof deposited by chemical vapor deposition (CVD) or the like. Other materials and methods of forming the pad layer 32 and the hardmask layer 30 may be used. In some examples, the pad layer 32 may have a thickness of between approximately 5 nm and approximately 40 nm, and the hardmask layer 30 may have a thickness of between approximately 20 nm and approximately 160 nm. In some examples, the pad layer 32 may have a thickness of between approximately 0.5 nm and 3 nm.

In FIG. 2, the hardmask layer 30 and the pad layer 32 are patterned, and used as a mask to form a fin 34. The patterning of the hardmask layer 30 and the pad layer 32 may use any suitable photolithography and etching process, such as a reactive ion etch (RIE), a neutral beam etch (NBE), or the like. Using the hardmask layer 30 and the pad layer 32 as a mask, the substrate 20 is etched to form the fin 34. The etching may use any suitable etching process, such as RIE, NBE, or the like. A plurality of fins (not shown) parallel with the fin 34 can be formed at either side of the fin 34 in a way similar to the fin 34 on the substrate 20. The etching can form trenches between the fins. It will be appreciated that the fins may or may not have sidewalls that are entirely vertical. The bottoms of the fins may in fact be larger in width than the top portions thereof.

Figure 3:
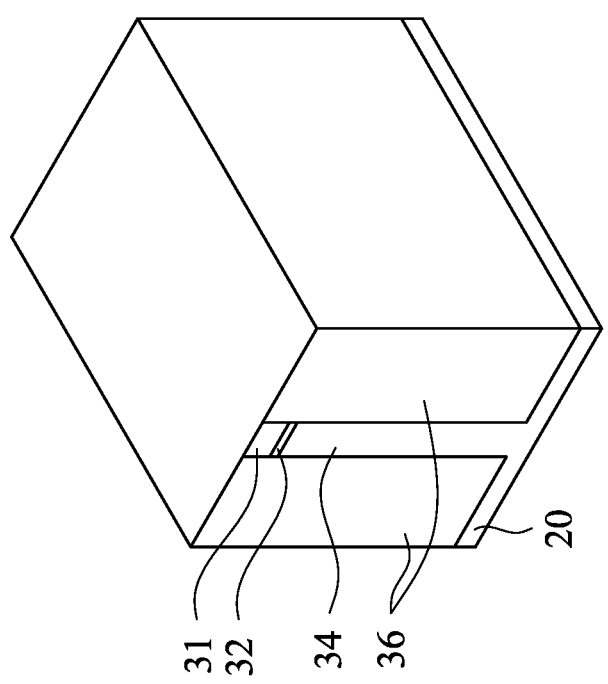

In FIG. 3, the trenches are filled with an insulation material 36. The insulation material 36 may be an oxide, such as silicon oxide, a nitride, and the like, or a combination thereof. The insulation material 36 may be formed by a high density plasma chemical vapor deposition (HDP-CVD), a flowable CVD (FCVD) (e.g., a CVD-based material deposition in a remote plasma system and post curing to make it convert to another material, such as an oxide), and the like, or a combination thereof. Other insulation materials formed by any suitable process may be used. An anneal process may be performed once the insulation material 36 is formed. Further, a planarization process, such as a chemical mechanical polishing/planarization (CMP), may remove any excess insulation material.

Particularly, an upper portion of the hardmask layer 30 may be removed during the planarization process. A lower portion of the hardmask layer 30 (designated with the number 31) may be retained as shown in FIG. 3. For example, processing time of the planarization process may be controlled to obtain the retained hardmask layer 31 with a desired thickness. As a result of the planarization process, top surfaces of the insulation material 36 and a top surface of the retained hardmask layer 31 are co-planar. The retained hardmask layer 31 can be referred to as a fin top hardmask 31. In some examples, the fin top hardmask 31 can have a thickness of between approximately 0.5 nm and approximately 2.5 nm. In alternative examples, the fin top hardmask 31 can have a thickness of between approximately 2 nm and approximately 10 nm. In some examples, the pad layer 32 may have a thickness of between approximately 0.5 nm and 3 nm.

Figure 4:
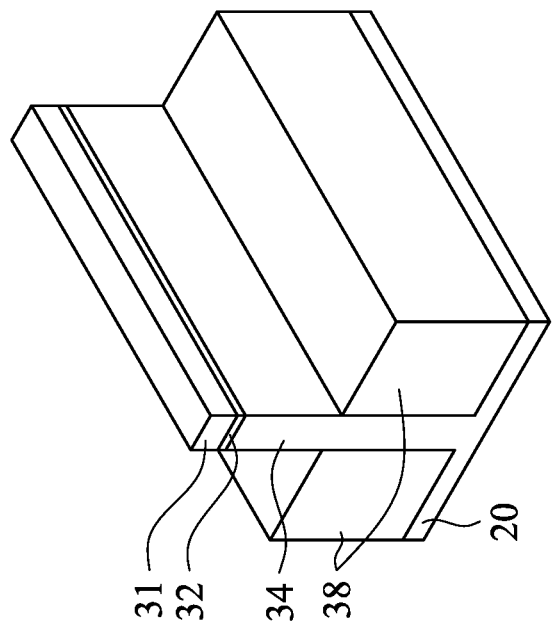

In FIG. 4, the insulation material 36 is recessed to form isolation regions 38, which may be referred to as shallow trench isolation (STI) regions, and to cause the fin 34 to protrude from between neighboring isolation regions 38. The insulation material 36 may be recessed using an acceptable etching process, such as one that is selective to the material of the insulation material 36. For example, the recessing process may include a dry etching process, a wet etching process, and/or a combination thereof. For example, the recessing process may include a dry, plasma-free process using a reaction gas or reaction gas combination, such as $HF+NH_3$, or plasma process, using a reaction gas or a reaction gas combination, such as $NF_3+NH_3$, and/or other suitable reaction gases. In some embodiments, the dry, plasma-free recessing process is performed using a CERTAS® Gas Chemical Etch System, available from Tokyo Electron Limited, Tokyo, Japan. In some examples, the dry, plasma recessing process is performed using a SICONI® System, available from Applied Materials, Inc., Santa Clara, Calif. In other examples, the recessing process may include a wet etch performed using a dilute mixture of HF (e.g., 49% HF in $H_2O$ by weight) and de-ionized (DI) $H_2O$, where the $HF:H_2O$ ratio is approximately 1:50 or approximately 1:100. In some embodiments, a recessing depth is controlled (e.g., by controlling an etching time) so as to result in a desired height of an exposed upper portion of the fin 34. In some examples, the fin height (the exposed upper portion of the fin 34) may be between approximately 20 nm and approximately 40 nm. In some examples, the fin height may be between approximately 40 nm and approximately 90 nm.

Figure 5:
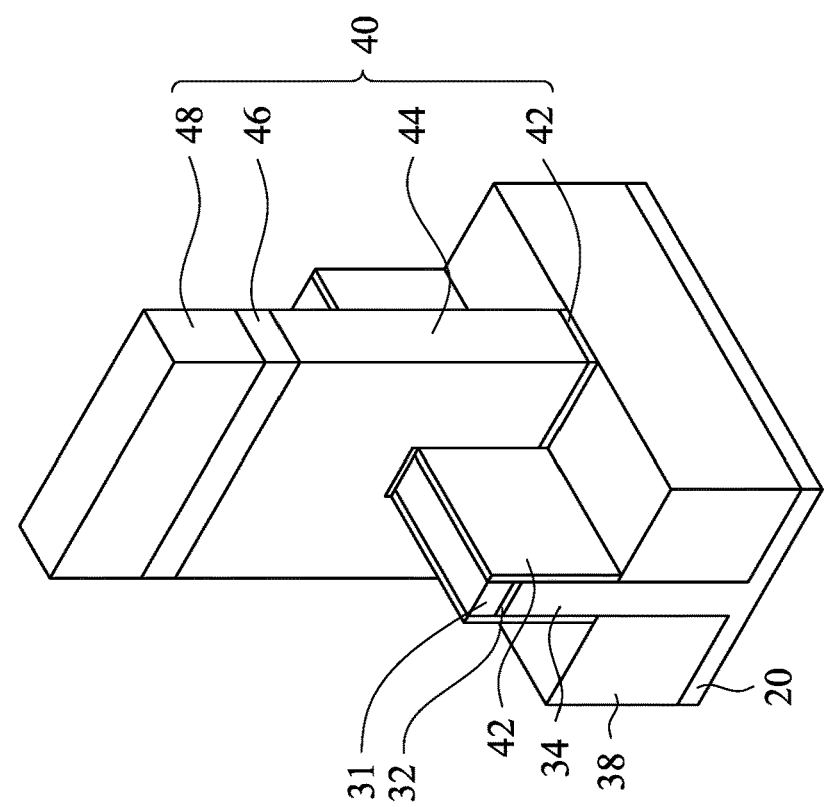

In FIG. 5, a dummy gate stack 40 is formed. For example, a dummy dielectric layer 42 may first be conformally formed on the surface of structures over the substrate 20, including the fin 34, the pad layer 32, the fin top hardmask 31, and the STI regions 38. The dummy dielectric layer 42 may be, for example, silicon oxide, silicon nitride, a combination thereof, or the like, and may be deposited or thermally grown according to acceptable techniques, such as CVD, thermal oxidation, or the like.

Subsequently, a dummy gate layer 44 is formed over the dummy dielectric layer 42. The dummy gate layer 44 may be deposited, such as by using CVD or the like, over the dummy dielectric layer 42 and then planarized, such as by a CMP. The dummy gate layer 44 may include, for example, polysilicon, although other materials that have a high etching selectivity may also be used. Mask layers 46 and 48 are then formed over the dummy gate layer 44. The mask layers 46 and 48 may be deposited, such as by using CVD or the like, over the dummy gate layer 44. In accordance with some embodiments, the mask layer 46 is formed of silicon oxide, silicon oxycarbonitride, or the like. In accordance with some embodiments, the mask layer 48 may be formed of silicon nitride.

Thereafter, the mask layers 46 and 48 are patterned using acceptable photolithography and etching techniques to form a mask. Further, the dummy gate layer 44 and dummy dielectric layer 42 are patterned, such as by transferring the pattern of the masks 46 and 48, by using an acceptable etching technique to form the dummy gate stack 40. The etching may include an acceptable anisotropic etching, such as RIE, NBE, or the like. Particularly, the fin top hardmask 31 may serve as an etch stop layer protecting the fin 34 from being damaged by the etching. A portion of the fin 34 sandwiched by the gate stack 40 forms a channel region. In some embodiments, outside the channel region, portions of the dummy dielectric layer 42 may remain on the sidewalls of layers of the fin 34, the pad layer 32, and the fin top hardmask 31 after the etching.

The resulting dummy gate stack 40 crosses the fin 34 and straddles a respective channel region of the fin 34. The resulting dummy gate stack 40 will be replaced with a replacement gate stack at a subsequent processing stage in the formation of the FinFET devices. In particular, the dummy gate stack 40 may be replaced at a later processing stage by a high-K dielectric layer (HK) and metal gate materials. Such a fabrication process of replacing a dummy gate stack with a replacement gate stack is known as a gate-last process.

While embodiments are described herein by way of an exemplary gate-last process, it will be understood that embodiments of the present disclosure are not limited to such a process. In some embodiments, various aspects of the present disclosure may be applicable to a gate-first process. In some examples, a gate-first process includes formation of a gate stack prior to source/drain formation or source/drain dopant activation. Merely by way of example, a gate-first process may include gate dielectric and metal gate depositions over the STI regions 38 and the fin top hardmask 31, followed by a gate stack etch process to define a gate critical dimension (CD). In some embodiments of a gate-first process, gate stack formation may be followed by source/drain formation including doping of source/drain regions and, in some examples, annealing for source/drain dopant activation.

Figure 6:
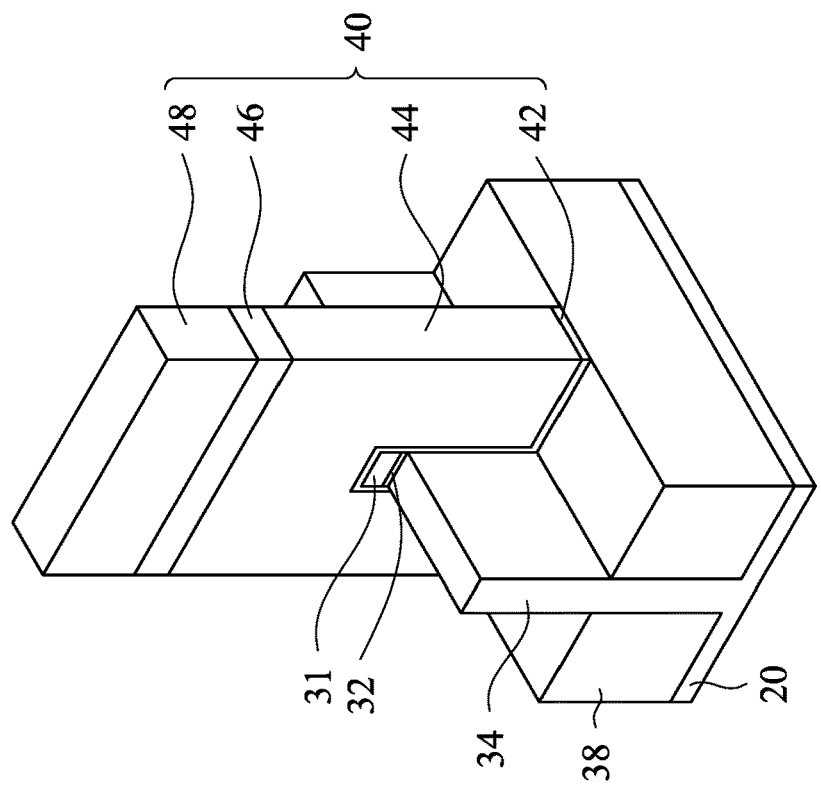

In FIG. 6, a portion of the fin top hardmask 31 and the pad layer 32 that is outside the channel region and not covered by the dummy gate stack 40 is removed. The dummy oxide layer 42 remaining on the sidewalls of the fin 34 outside the channel region is also removed. As a result of this step illustrated in FIG. 6, the fin 34 outside the channel region is exposed. The fin top hardmask 31 and the pad layer 32 on top of the fin 34 at the channel region are retained. Suitable etching techniques, such as RIE, NBE, or the like, can be employed to remove the respective portion of the fin top hardmask 31, the pad layer 32, and the dummy oxide layer 42. As a side effect, the etching may remove a part of the hardmask 48 of the dummy gate stack 40 in some embodiments where the hardmask 48 and the fin top hard mask 31 may use a similar material. As the dummy gate stack 40 will be replaced with a replacement gate stack, the side effect does not induce any disadvantage.

Although not specifically illustrated, implants for lightly doped source/drain (LDD) regions may be performed. For a p-type or n-type device, p-type or n-type impurities may be implanted into the exposed portions of the fin 34, respectively. The p-type impurities may be boron, $BF_2$, or the like, and the n-type impurities may be phosphorus, arsenic, or the like, in accordance with some embodiments. An anneal process may be used to activate the implanted impurities.

Figure 7:
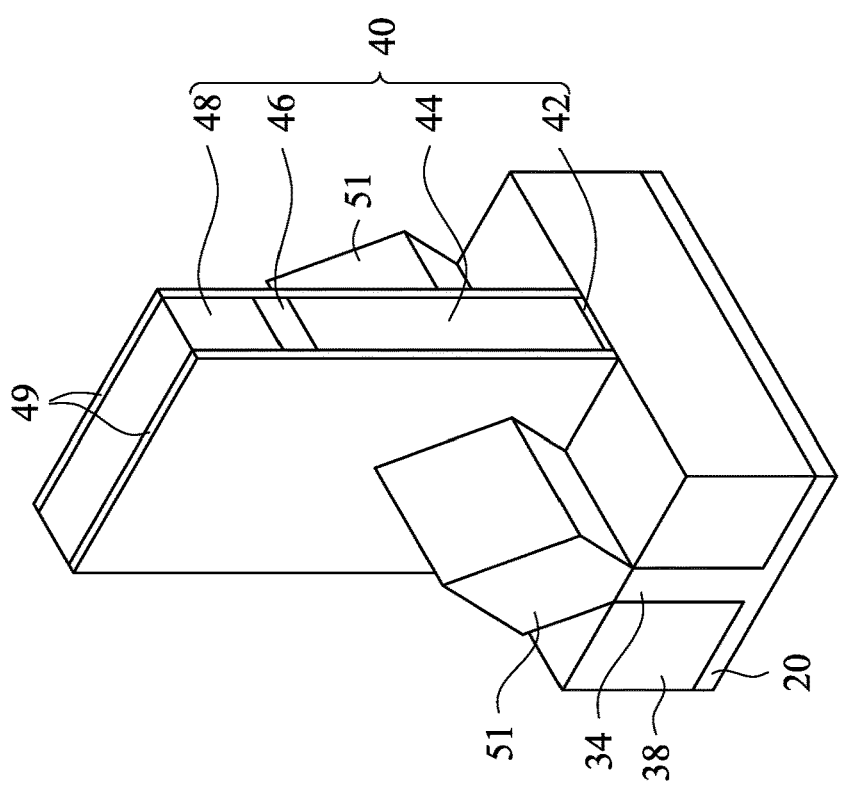

In FIG. 7, a pair of spacers 49 is formed on opposite sidewalls of the dummy gate stack 40 and over the exposed portions of the fin 34. The spacers 49 may include a dielectric material such as silicon oxide, silicon nitride, silicon carbide, silicon oxynitride, or combinations thereof. In some embodiments, each spacer 49 includes multiple layers, such as main spacer walls, liner layers, and the like. For example, the pair of spacers 49 may be formed by depositing a dielectric material over the gate stack 40 and anisotropically etching back the dielectric material. In some embodiments, the etch-back process (e.g., for spacer formation) may include a multiple-step etching process to improve etch selectivity and provide over-etch control.

Further in FIG. 7, epitaxial source/drain regions 51 are formed in the fin 34 at opposite sides of the dummy stack 40. For example, an etching selective to the material(s) of the fin 34 is first performed. The etching can be any acceptable etching, such as a dry or wet etch, which may be anisotropic or isotropic. In some embodiments, the etching can include a dry etch using an F-based gas, Cl-based gas, or the like. The etching removes exposed portions of the fin 34. The epitaxial source/drain regions 51 are then epitaxially grown on the fin 34 at opposite sides of the dummy stack 40. The epitaxial growth may use MOCVD, MBE, LPE, VPE, the like, or a combination thereof. The epitaxial source/drain regions 51 may include any suitable materials appropriate for the device types. For example, the epitaxial source/drain regions 51 for an n-type device may include silicon, SiP, SiC, SiCP, the like, or a combination thereof. For example, the epitaxial source/drain regions 51 for a p-type device may include SiGe, SiGeB, Ge, GeSn, or the like. In accordance of some embodiments, the source/drain regions 51 may be in-situ doped during the epitaxial growth process, or an implantation process is performed to dope the source/drain regions 51. While the epitaxial source/drain regions 51 are shown to be built above the top surfaces of the isolation regions 38 in FIG. 7, in alternative examples, the epitaxial source/drain regions 51 may extend downward and have a portion below the top surfaces of the isolation regions 38.

Figure 8:
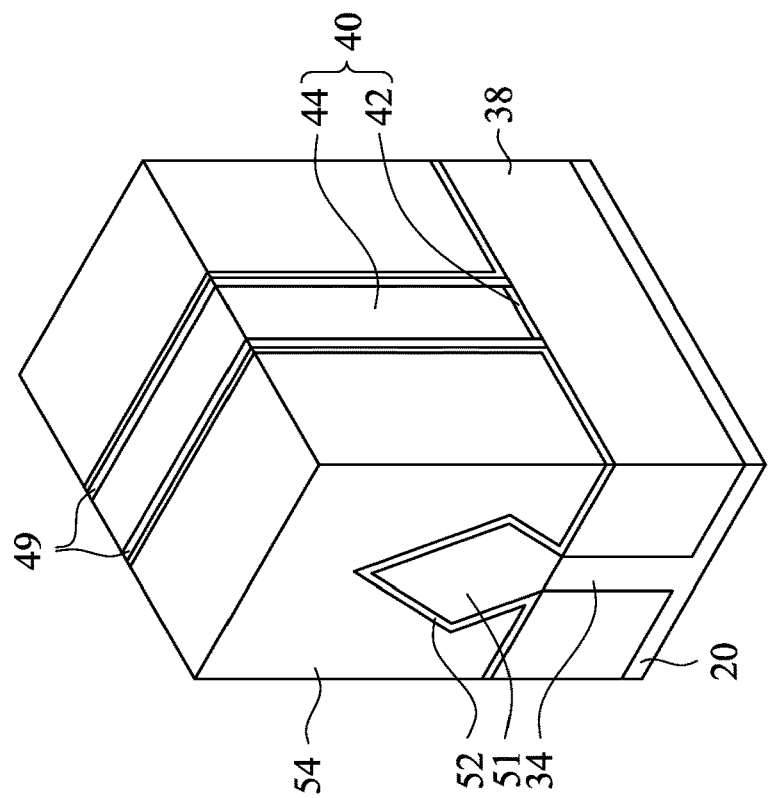

In FIG. 8, an etch stop layer (ESL) 52 and a bottom inter-layer dielectric (ILDO) layer 54 is formed over the substrate 20. The etch stop layer (ESL) can be conformally formed on the epitaxial source/drain regions 51, the gate spacers 49, the hardmask 48, and the isolation regions 38. In some embodiments, the ESL may include silicon nitride, silicon carbonitride, or the like, formed using Atomic Layer Deposition (ALD), CVD, the like, or a combination thereof. The ILDO layer 54 can be deposited over the ESL 52. The ILDO layer 54 may include phospho-silicate glass (PSG), boro-silicate glass (BSG), boron-doped phospho-silicate glass (BPSG), undoped silicate glass (USG), or the like, and may be deposited by any suitable method, such as CVD, plasma-enhanced CVD (PECVD), FCVD, the like, or a combination thereof.

A planarization process, such as a CMP, is performed to level the top surface of ILDO layer 54 with the top surface of the dummy gate 44. The CMP may also remove the masks 46 and 48 from over the dummy gate 44. Accordingly, top surfaces of the dummy gate 44 are exposed through the ILDO layer 54.

Figure 9:
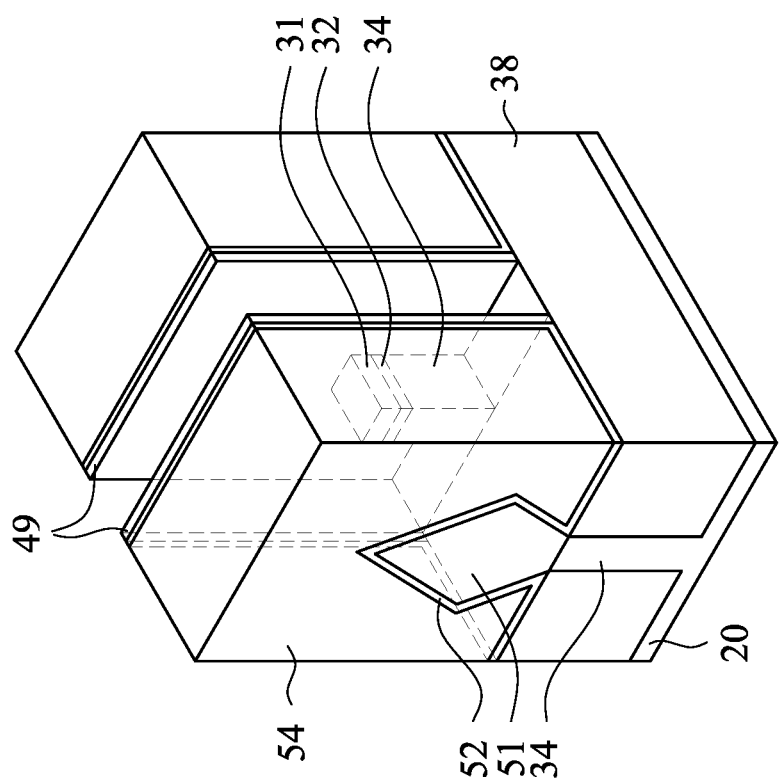

In FIG. 9, the dummy gate stack 40 (including the dummy gate 44 and the dummy dielectric 42) are removed, such that an opening through the ILDO layer 54 and defined by the gate spacers 49 are formed across the fin 34. The opening exposes the channel region of the fin 34, the pad layer 32, and the fin top hardmask 31. The channel region of the fin 34 is disposed between the neighboring pair of epitaxial source/drain regions 51. The fin top hardmask 31 and the pad layer 32 are disposed between the two gate spacers 49. The removal of the dummy gate stack 40 may use an etching process selective to the materials of the dummy gate stack 40 (the dummy gate 44 and the dummy gate dielectric 42). The etching may be a dry or wet etching. During the etching, the dummy gate dielectric 42 may be used as an etch stop layer when the dummy gate 44 are etched. The dummy gate dielectric 42 may subsequently be etched after the removal of the dummy gate 44.

Particularly, in some embodiments, due to fin pitch and gate length scaling for advanced fabrication technologies, a heavy etch may be performed to make sure that no dummy gate residue (e.g., poly silicon) remains after removal of the dummy gate 44. The heavy etch may etch through the dummy gate dielectric 42 disposed over the top surface of the fin top hardmask 31, and thus would cause damage to a top portion of the channel region of the fin 34 if the fin top hardmask 31 were not present. The remaining fin top hardmask 31 can advantageously serve as an etch stop layer protecting the channel region of the fin 34 from being damaged during the dummy gate 44 removal process.

In FIGS. 10A-10B, 11A-11B, 12A-12C, a replacement gate stack is formed straddling the channel region of the fin 34 and the fin top hardmask 31 between the pair of spacers 49. In some embodiments, the replacement gate stack includes an interfacial layer, a gate dielectric layer, and a gate conductive layer. The interfacial layer is formed over surfaces of the channel region of the fin 34, the pad layer 32, and the fin top hardmask 31. The gate dielectric layer is formed over the interfacial layer and sidewall surfaces of the spacers 49. The gate conductive layer is formed over the gate dielectric layer. The formation of the replacement gate stacks can include depositions to form various gate materials, and one or more CMP processes to remove excessive gate materials and thereby planarize a top surface of the FinFet device.

In various embodiments, the interfacial layer of the replacement gate stack may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The interfacial layer may act as a glue/buffer layer.

In various embodiments, the gate dielectric layer of the replacement gate may be formed of silicon dioxide, silicon nitride, a high-k dielectric material having a k value greater than, for example, about 7.0, or other suitable dielectric. In some embodiments, the high-K dielectric material includes hafnium oxide ($HfO_2$). Alternatively, the high-K dielectric material may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable materials. The high-K gate dielectric material may be formed by ALD, physical vapor deposition (PVD), CVD, oxidation, and/or other suitable methods.

The gate conductive layer may serve as a transistor (e.g., FinFET) gate electrode, and can include a single layer or alternatively a multi-layer structure. In some embodiments, the gate conductive layer includes a polysilicon layer. In some embodiments, the gate conductive layer includes combinations of a metal layer with a selected work function to enhance the device performance (work function metal layer), liner layer, wetting layer, adhesion layer, metal alloy or metal silicide.

For example, the gate conductive layer may include one or more work function tuning layers conformally formed over the gate dielectric layer, and a metal-containing layer formed on the working function tuning layers and filling the openings through the ILDO layer 54 and defined by the gate spacers 49. The work function tuning layer(s) can be formed of TiAl, TiN, or the like using ALD, CVD, or the like. The metal-containing layer can be tungsten (W), aluminum (Al), cobalt (Co), ruthenium (Ru), a combination thereof, or the like, deposited using CVD, PVD, the like, or a combination thereof.

The work function tuning layer(s) may provide an N-type or P-type work function for an N-type FinFET or a P-type FinFET, respectively. For example, a first work function tuning layer (e.g., for N-type devices) may include metals having a work function substantially aligned with a work function of the substrate conduction band, or at least substantially aligned with a work function of the conduction band of the channel region of the fin. Similarly, for example, a second work function tuning layer (e.g., for P-type devices) may include metals having a work function substantially aligned with a work function of the substrate valence band, or at least substantially aligned with a work function of the valence band of the channel region of the fin.

A planarization process, such as a CMP, may be performed to remove the excess portions of the gate dielectric layer and the gate conductive layer, which excess portions are over the top surface of ILDO layer 54.

Figure 10B:
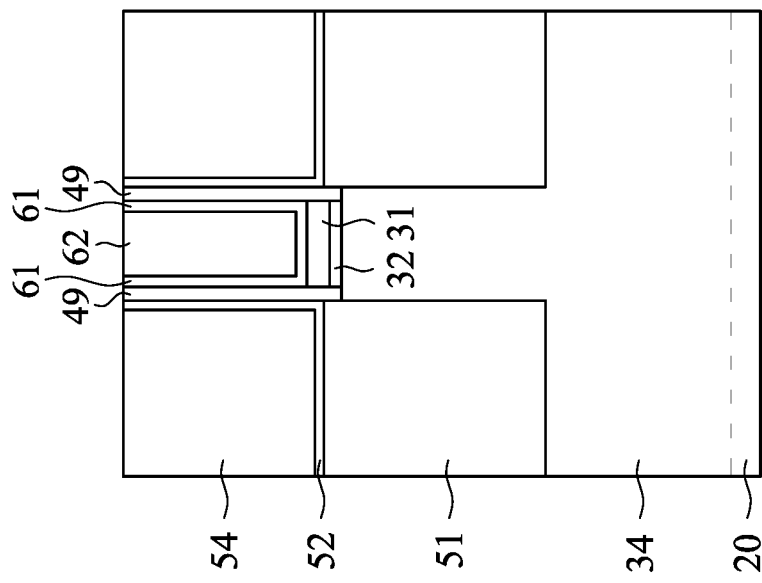
FIGS. 10B/11B/12B/12C/12D/13B are cross-sectional views of intermediate stages in the formation of FinFET devices in accordance with some embodiments.
Figure 10A:
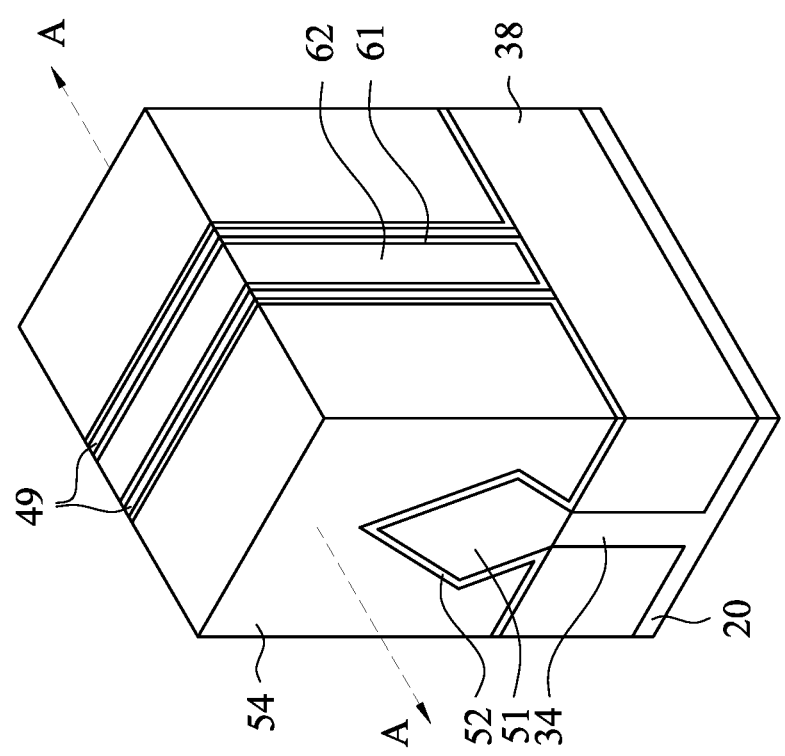
FIGS. 10A/11A/12A/13A are perspective views of intermediate stages in the formation of FinFET devices in accordance with some embodiments.
Figure 11B:
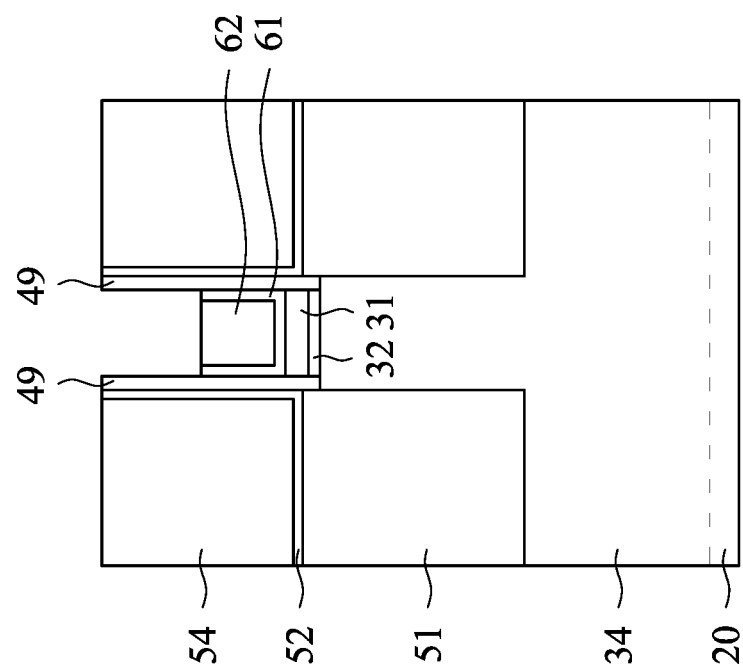
Figure 11A:
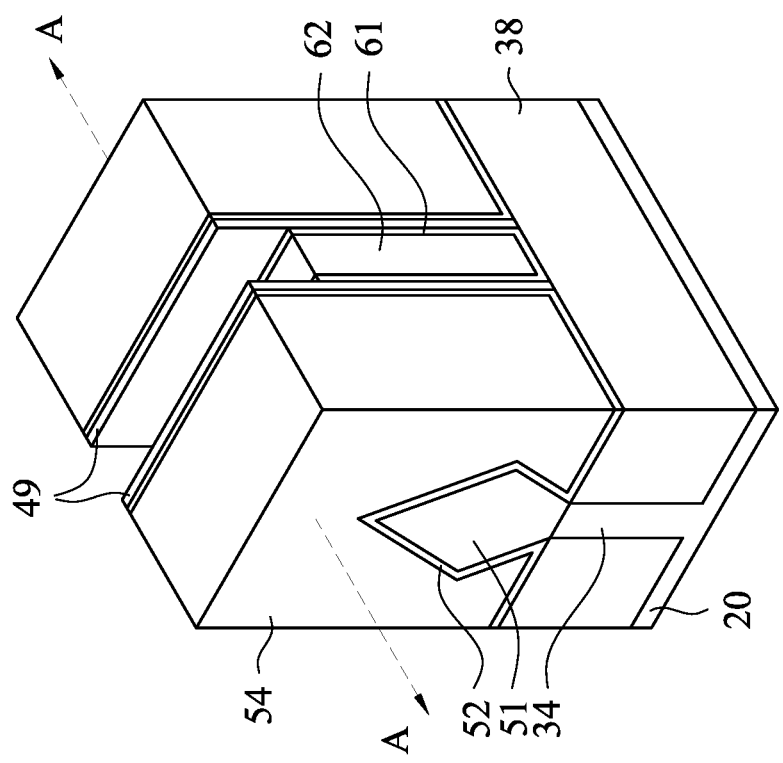
Figure 12B:
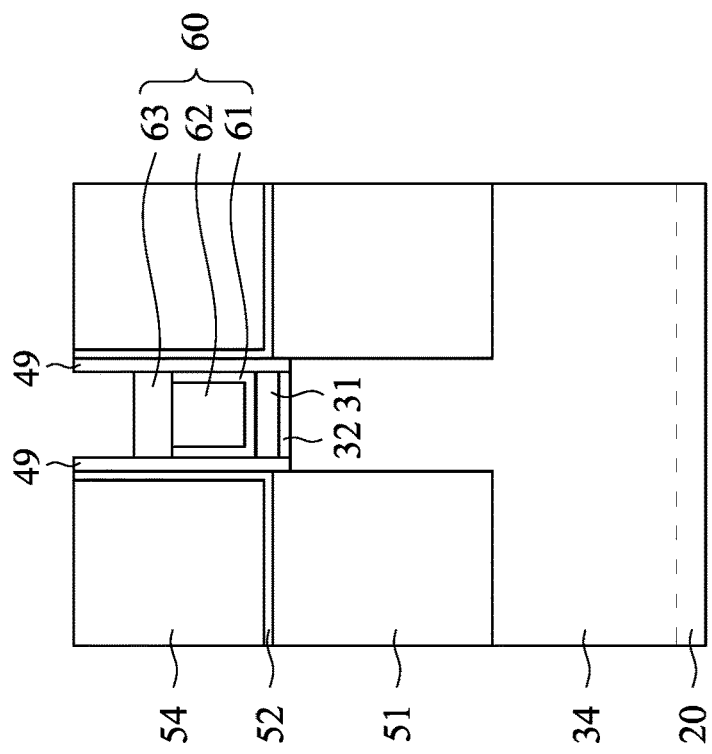
Figure 12A:
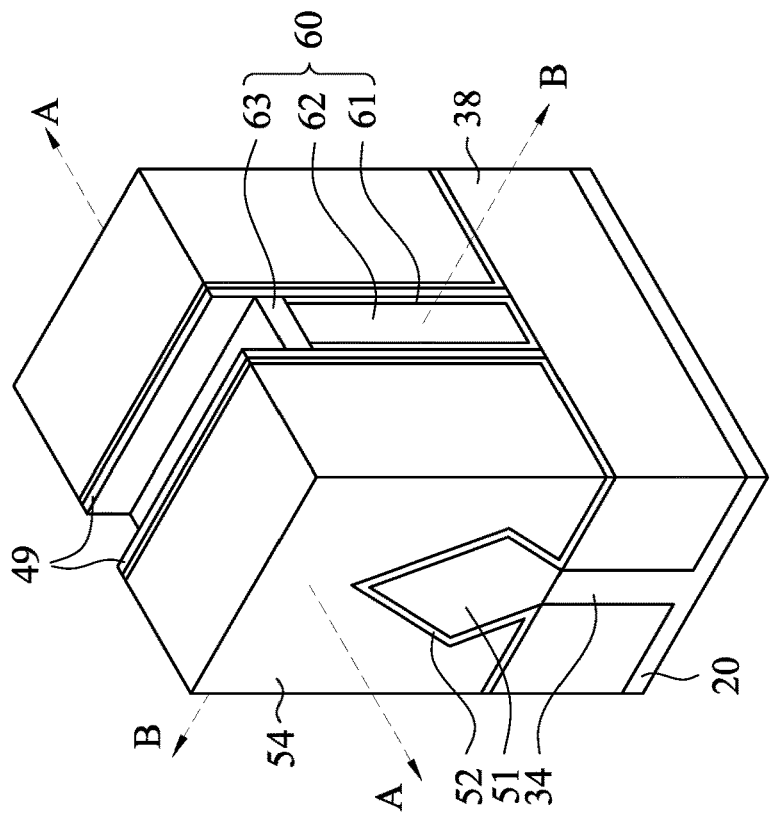
Figure 12D:
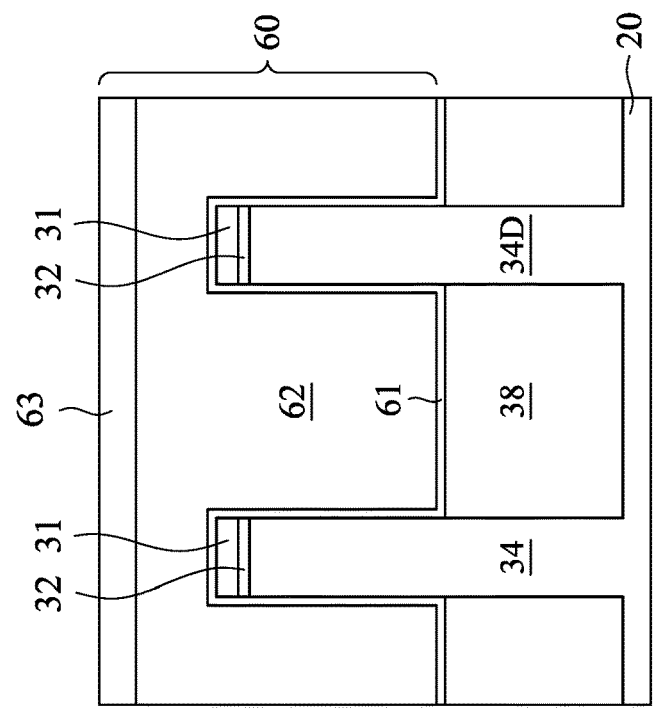
Figure 12C:
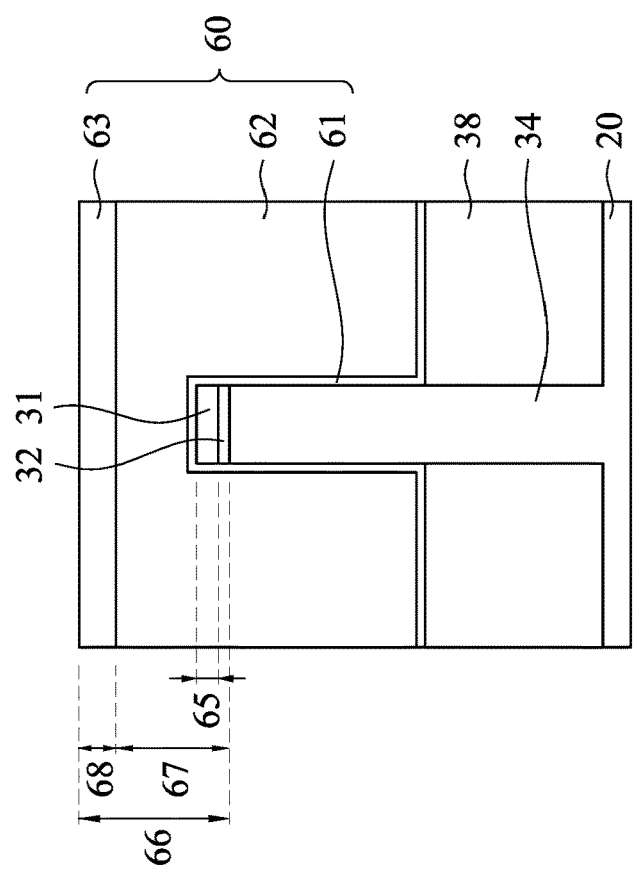

FIGS. 10A-10B, 11A-11B, 12A-12C illustrate a specific example of forming the replacement gate stack. FIGS. 10A/11A/12A are perspective views of intermediate stages of a FinFET device following process steps of FIG. 9. In addition, FIGS. 10B/11B/12B are cross-sectional views of the respective intermediate stages shown in FIGS. 10A/11A/12A obtained from a vertical plane along the fin 34 and passing a line A-A in FIGS. 10A/11A/12A, respectively. FIG. 12C is a cross-sectional view of the intermediate stage shown in FIG. 12A obtained from a vertical plane across the fin 34 and passing a line B-B in FIG. 12A.

In FIGS. 10A-10B, an interfacial layer (not shown) may first be formed over surfaces of the fin 34, the pad layer 32, and the fin top hardmask 31 at the channel region. A gate dielectric layer 61 (e.g., high-K dielectric) is subsequently conformally formed over the interfacial layer, the sidewalls of the spacers 49, and the surfaces of the STI regions 38. Then, a work function tuning layer 62 can be formed over the gate dielectric layer 61. Specifically, the work function tuning layer 62 fills openings between the pacers 49. Although not shown, in some examples, seams may sometimes result from a conformal or non-conformal deposition process for forming the work function tuning layer 62. For example, when a gate width dimension (a distance between spacers 49) is small for a short-channel device, a seam or void may be formed at the end of a deposition process for forming the work function tuning layer 62. In some examples, the seam may increase a resistance of a replacement gate stack, thus may be removed, for example, by filling in a conductive material when a metal-containing layer is later formed. Following formation of the work function tuning layer 62, a planarization process (e.g., CMP) may be performed to remove the excess portions of the gate dielectric layer 61 and the work function tuning layer 62 to expose a top surface of the gate structure between the spacers 49.

Further in FIGS. 11A-11B, the gate dielectric layer 61 and the work function tuning layer 62 are partially recessed by performing an etch-back process. The etching can be selective to the gate dielectric layer 61 and the work function tuning layer 62. The etching may include a dry etch and/or a wet etch, and may be isotropic or anisotropic. Particularly, in some embodiments, a recessing depth is controlled (e.g., by controlling an etching time) so as to result in a desired vertical thickness of the remaining work function tuning layer 62 and the gate dielectric layer 61 above the fin top hardmask 31. In some examples, the seam previously formed in the work function tuning layer 62 may be exposed as a result of the recession.

In FIGS. 12A-12C, a horizontally spreading metal-containing layer 63 is formed on the top surface of the work function tuning layer 62 and the gate dielectric layer 61, thus forming a replacement gate stack 60. In accordance with some embodiments, hydrogen-based processes may be employed to prepare/engineer the exposed surface of the work function tuning layer 62 such that subsequent metal deposition takes place selectively on the exposed metal surface as opposed to non-metal surfaces such as the surfaces of dielectric materials. Deposition time of the metal-containing layer 63 may be controlled so that the metal-containing layer 63 may be confined to a lower portion of the recess formed in FIGS. 11A-11B, leaving the upper portion of the recess unfilled. In one embodiment, the metal-containing layer 63 includes a layer of tungsten (W).

The thus formed replacement gate stack 60 includes the gate dielectric layer 61, the work function tuning layer 62, and the metal-containing layer 63 disposed between sidewalls of the two spacers 49. The replacement gate stack 60 straddles the channel region of the fin 34, the pad layer 32, and the fin top hardmask 31. Under such a configuration, as shown in FIGS. 12B-12C, the fin top hard mask 31 can act as an isolation layer such that reducing a height 67 of the work function tuning layer 62 will not have an adverse effect on proper function of gate channels along the sidewalls of the fin 34 at the channel region. Accordingly, a desired gate height 66 can be achieved by lowering the height 67 of the work function tuning layer 62 to serve the purpose of reducing the parasitic capacitance between the gate stack 60 and a source/drain contact.

A gate height can refer to a height of the top surface of a gate stack in a FinFET device. In the example of FIG. 12C, the gate height 66 is defined as a distance between the top surface of the replacement gate stack 60 and the top surface of the fin 34 at the channel region. The height 67 of the work function tuning layer 62 is defined to be a distance between the top surface of the work function tuning layer 62 and the top surface of the fin 34 at the channel region. In accordance with some embodiments, the lowered gate height 66 can be in a range of about 9 nm to 14 nm. The reduced height of the work function tuning layer 62 can be in a range of about 6 nm to 10 nm. A thickness 65 of the fin top hardmask 31 can be in a range of about 1 nm-3 nm. In a specific example, the thickness 65 of the fin top hardmask 31 is smaller than 1.5 nm. A thickness 68 of the metal-containing layer 63 can be in a range of about 2 nm to 6 nm. Of course, depending on the fabrication technologies employed for fabricating various FinFET devices, dimensions of respective gate structures can vary.

FIG. 12D is a cross-sectional view of an intermediate stage of a FinFET device including the fin 34 and a dummy fin 34D disposed in parallel with the fin 34. In some examples, one or more dummy fins can be positioned neighboring active fins (e.g., the fin 34) to mitigate device density variation effects and/or layout-dependent effects (LDE). As shown in FIG. 12D, the dummy fin 34D can have a structure similar to that of the fin 34 with a pad layer 32 and a fin top hardmask 31 at the top of the dummy fin 34D. The gate stack 60 can cross over the dummy fin 34D and straddle the dummy fin 34D in a manner similar to straddling the fin 34. In some examples, the structure of the dummy fin 34D can be formed with a same fabrication process as the active fin 34 as described above with reference to FIGS. 1-12C.

Figure 13B:
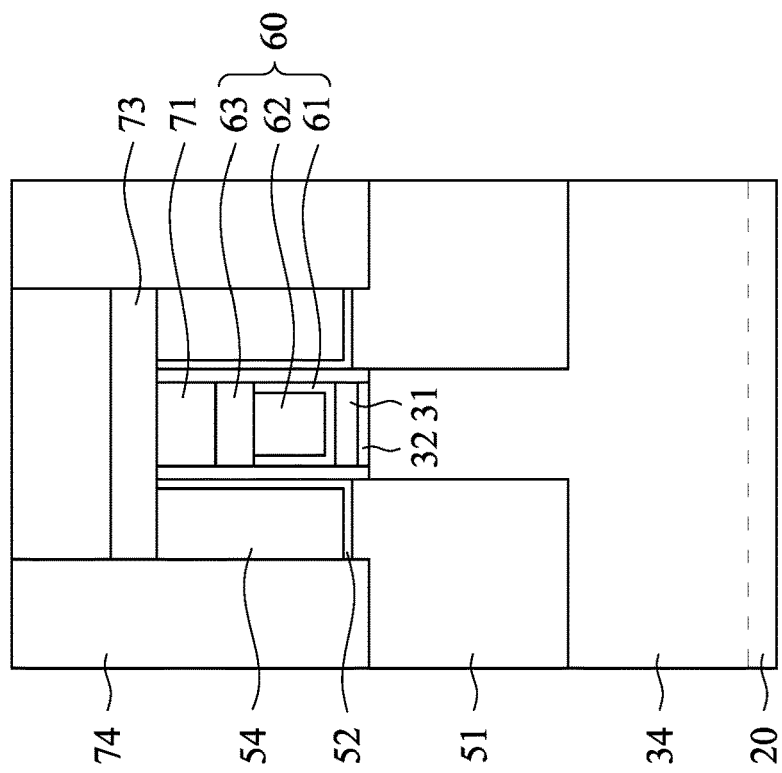
Figure 13A:
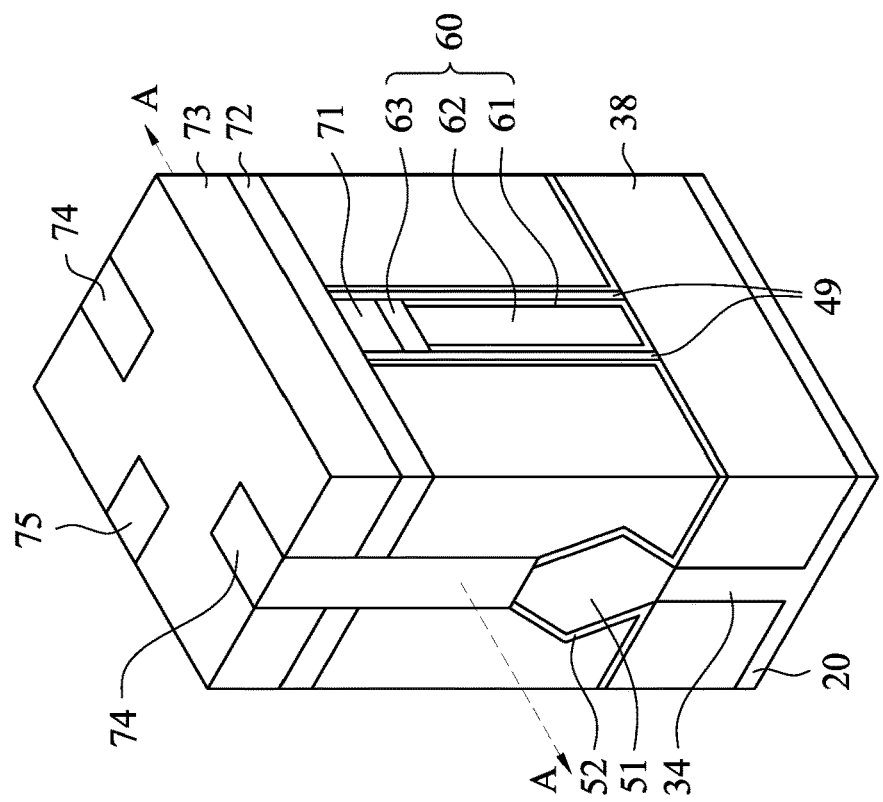

FIG. 13A is a perspective view of an intermediate stage of a FinFET device following process steps of FIGS. 12A-12C. FIG. 13B is a cross sectional view of the intermediate stage shown in FIG. 13A obtained from a vertical plane along the fin 34 and passing a line A-A in FIG. 13A. In FIGS. 13A-13B, the recess above the work function tuning layer 62 is filled with a dielectric material to form a dielectric helmet 71. An etch stop layer 72 is formed over the ILDO layer 54 and the dielectric helmet 71. In some embodiments, the dielectric helmet 71 and the etch stop layer 72 can be formed successively during a same deposition process. The dielectric layer 71 and the etch stop layer 72 can protect the gate structure of the FinFET during a self-aligned contact (SAC) etch. For example, the dielectric layer 71 and the etch stop layer 72 can include dielectric materials, such as silicon carbide, silicon nitride, silicon oxynitride, or the like.

Subsequently, an inter-layer dielectric (ILD) layer 73 is formed over the etch stop layer 72, and contact plugs 74 and 75 are formed. A first formation process may include forming contact plug openings through the ILD layer 73, the etch stop layer 72, and the ILDO layer 54 to expose the source/drain regions 51, and filling the contact plug openings with a conductive material to form contact plugs 74. The ESL 52 is also removed, so that the contact plugs 74 extend to the source/drain regions 51. A second formation process may include forming contact plug openings in the ILD layer 73, the etch stop layer 72, and the dielectric helmet 71 to expose the replacement gate stack 60, and filling the respective contact plug openings with a conductive material to form the contact plug 75.

It should be noted that additional steps can be provided before, during, and after the fabrication processes described with reference to FIGS. 1-13B, and some of the steps described can be replaced, eliminated, or performed in a different order. The resulting FinFET devices may include additional features, which may be formed by subsequent processing. For example, various vias/lines and multilayers interconnect features (e.g., metal layers and interlayer dielectrics) are formed over the substrate 20. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The various embodiments described herein offer several advantages over the existing art. For example, the FinFET devices described herein incorporates a fin top hardmask on top of a channel region of a fin. Because of the presence of the fin top hardmask, a gate height of the FinFET devices can be reduced without affecting proper operations of gate channels formed on sidewalls of the fins. Consequently, the parasitic capacitance between a gate stack and source/drain contacts of a FinFET can be reduced by lowering the gate height of the FinFET device. In addition, the fin top hardmask can serve as an etch stop layer to protect a fin from being damaged during an etching for removing a dummy gate stack.

One of the embodiments provides a semiconductor device. The semiconductor device includes a fin over a substrate, a fin top hardmask over a top surface of a channel region of the fin, a gate stack straddling the fin and the fin top hardmask, a pair of spacers disposed over the fin and adjacent to opposite sidewalls of the gate stack, and a source/drain region disposed adjacent to one of the pair of spacers.

Another embodiment provides a FinFET that includes a fin top hardmask on a top surface of a channel region of a fin, and a gate stack straddling the fin and the fin top hardmask. The gate stack can include a top portion that includes a horizontally spreading metal-containing layer, and a lower portion that includes a gate dielectric layer and a work function tuning layer over the gate dielectric layer.

A method for semiconductor device fabrication is described in accordance with some embodiments. In the method, a fin on a substrate with a fin top hardmask retained on a top surface of the fin can first be formed. A dummy gate stack straddling a channel region of the fin and the fin top hardmask can then be formed. Subsequently, a portion of the fin top hardmask that is not covered by the dummy gate stack can be removed followed by forming a pair of spacers disposed over the fin and adjacent to opposite sidewalls of the gate stack. Finally, the dummy gate stack can be replaced with a replacement gate stack straddling the channel region of the fin and the remaining portion of the fin top hardmask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin on a substrate with a fin top hardmask retained on a top surface of the fin;
   forming a dummy gate stack straddling a channel region of the fin and the fin top hardmask;
   removing a portion of the fin top hardmask that is not covered by the dummy gate stack;
   forming a pair of spacers over the fin and adjacent to opposite sidewalls of the dummy gate stack; and
   replacing the dummy gate stack with a replacement gate stack over the channel region of the fin and a remaining portion of the fin top hardmask disposed on a top surface of the channel region of the fin, wherein in a cross-sectional view a bottom surface of the replacement gate stack is higher than a bottom surface of the remaining portion of the fin top hardmask.

2. The method of claim 1, wherein the forming the fin on the substrate with the fin top hardmask retained on the top surface of the fin comprises:
   providing the substrate;
   forming a hardmask layer over the substrate;
   patterning the hardmask layer;
   patterning the substrate to form the fin and trenches neighboring the fin using the patterned hardmask layer;
   filling the trenches neighboring the fin with an insulation material;
   performing a planarization process to remove excess insulation material, wherein a portion of the hardmask layer is retained forming the fin top hardmask; and
   recessing the insulation material in the trenches neighboring the fin to form shallow trench isolation (STI) regions, the dummy gate stack being on top surfaces of the STI regions.

3. The method of claim 2, further comprising:
   forming a pad layer over the substrate prior to forming the hardmask layer over the substrate.

4. The method of claim 1, wherein the replacing the dummy gate stack with the replacement gate stack comprises:
   removing the dummy gate stack to form an opening between the pair of spacers;
   forming a gate dielectric layer lining the opening between the pair of spacers;
   forming a work function tuning layer over the gate dielectric layer, the work function tuning layer filling the opening between the pair of spacers;
   recessing the gate dielectric layer and the work function tuning layer to lower a top surface of the gate dielectric layer and the work function tuning layer between the pair of spacers; and
   forming a metal-containing layer horizontally spreading over the top surface of the gate dielectric layer and the work function tuning layer between the pair of spacers.

5. The method of claim 4, wherein the metal-containing layer includes a layer of tungsten.

6. The method of claim 4, further comprising:
   forming a dielectric helmet over the metal-containing layer between the pair of spacers.

7. The method of claim 1, wherein the fin top hardmask is formed of at least one of SiCN, SiN, SiOCN, or SiON.

8. The method of claim 1, wherein the fin top hardmask has a thickness smaller than about 1.5 nm.

9. The method of claim 1, further comprising:
   after forming the pair of spacers over the fin and adjacent to the opposite sidewalls of the dummy gate stack, forming source and drain regions in the fin at opposite sides of the dummy gate stack; and
   depositing an inter-layer dielectric layer over the substrate.

10. A method comprising:
    forming a fin top hardmask over a substrate;
    etching the substrate by using the fin top hardmask as a mask to form a fin directly under the fin top hardmask;
    depositing a dummy dielectric film over the fin top hardmask and the fin;
    forming a dummy gate electrode over the dummy dielectric film;
    removing portions of the dummy dielectric film by using the dummy gate electrode as a mask to form a dummy dielectric layer, wherein a portion of the dummy dielectric layer free from coverage by the dummy gate electrode is in contact with a sidewall of the fin top hardmask; and
    replacing the dummy gate electrode with a metal gate structure.

11. The method of claim 10, further comprising:
    depositing a pad film over the substrate prior to forming the fin top hardmask; and
    patterning the pad film using the fin top hardmask as a mask to form a pad layer under the fin top hardmask.

12. The method of claim 11, wherein depositing the dummy dielectric film is such that the dummy dielectric film is in contact with sidewalls of the pad layer.

13. The method of claim 10, further comprising removing portions of the fin top hardmask after removing the portions of the dummy dielectric layer.

14. The method of claim 13, further comprising forming a spacer on a sidewall of the dummy gate electrode after removing the portions of the fin top hardmask, wherein the spacer is in contact with a remaining portion of the fin top hardmask.

15. The method of claim 10, wherein replacing the dummy gate electrode with the metal gate structure comprises:
    removing the dummy gate electrode to expose the fin top hardmask; and
    depositing the metal gate structure over the substrate to cover the fin top hardmask.

16. A method comprising:
    forming a fin top hardmask over a substrate;
    forming a trench in the substrate to define a fin under the fin top hardmask;
    depositing an insulation material in the trench;
    performing a planarization process to remove a top portion of the insulation material and a top portion of the fin top hardmask, wherein a bottom portion of the fin top hardmask remains covering the fin;
    recessing the insulation material to form an isolation structure in the trench;
    forming a gate structure over the bottom portion of the fin top hardmask and the isolation structure; and
    replacing the gate structure with a metal gate structure, wherein in a cross-sectional view, a top surface of the fin top hardmask is covered by the metal gate structure.

17. The method of claim 16, wherein forming the gate structure is such that the gate structure is in contact with the fin top hardmask and the isolation structure.

18. The method of claim 16, wherein replacing the gate structure with the metal gate structure comprises:
  removing the gate structure;
  depositing a gate dielectric layer over and in contact with the fin top hardmask and the isolation structure;
  depositing a work function tuning layer over the gate dielectric layer;
  etching back the gate dielectric layer and the work function tuning layer; and
  after etching back the gate dielectric layer and the work function tuning layer, depositing a metal-containing layer over the gate dielectric layer and the work function tuning layer.

19. The method of claim 18, wherein the metal-containing layer is in contact with the gate dielectric layer.

20. The method of claim 18, wherein replacing the gate structure with the metal gate structure further comprises:
  depositing a dielectric helmet over the metal-containing layer.

* * * * *